United States Patent [19]

Cullen et al.

[11] 4,213,104
[45] Jul. 15, 1980

[54] VACUUM ENCAPSULATION FOR SURFACE ACOUSTIC WAVE (SAW) DEVICES

[75] Inventors: Donald E. Cullen; Robert A. Wagner, both of Manchester, Conn.

[73] Assignee: United Technologies Corporation, Hartford, Conn.

[21] Appl. No.: 945,359

[22] Filed: Sep. 25, 1978

[51] Int. Cl.² .................. H03H 9/10; H03H 9/04; H03H 9/30
[52] U.S. Cl. ............................. 333/150; 310/341; 333/155; 333/193
[58] Field of Search ................. 333/150–155, 333/193–196; 310/313, 340, 341, 344; 29/25, 35; 174/52 S

[56] References Cited

U.S. PATENT DOCUMENTS 4,047,129  9/1977  Ishiyama ........................ 333/193

FOREIGN PATENT DOCUMENTS 1389610  4/1975  United Kingdom ............... 333/150

*Primary Examiner*—Alfred E. Smith
*Assistant Examiner*—Marvin Nussbaum
*Attorney, Agent, or Firm*—Dominic J. Chiantera

[57] ABSTRACT

A surface acoustic wave (SAW) device having a substrate of desired material is vacuum encapsulated in a structure fabricated from the same material as that comprising the substrate.

17 Claims, 3 Drawing Figures

U.S. Patent    Jul. 15, 1980    4,213,104
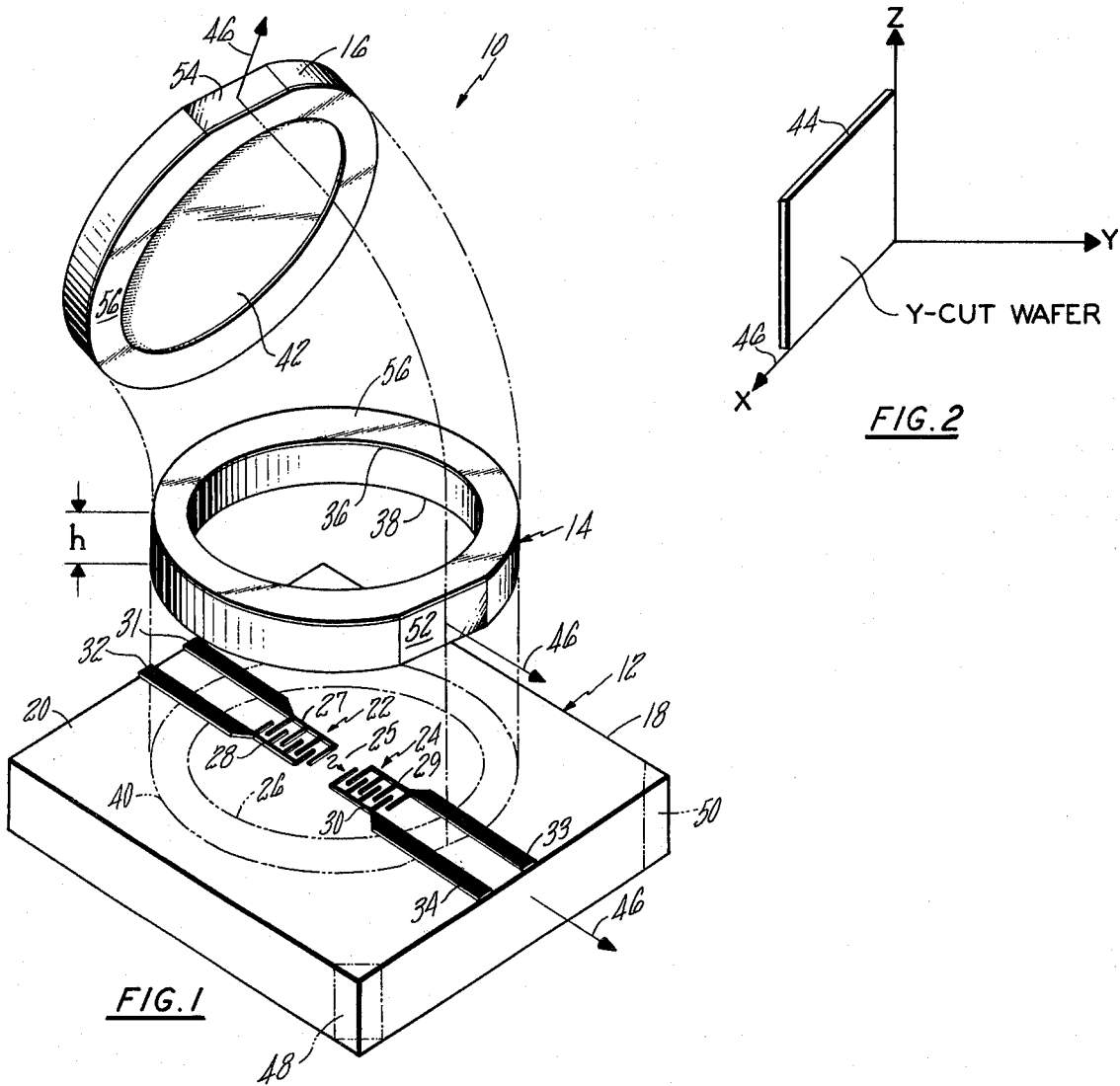
FIG.1
FIG.2
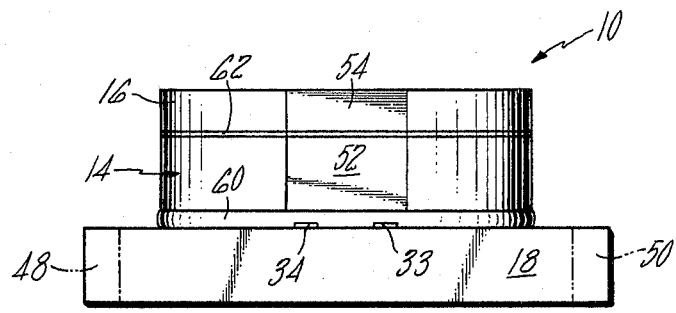
FIG.3

VACUUM ENCAPSULATION FOR SURFACE ACOUSTIC WAVE (SAW) DEVICES

The government has rights in this invention pursuant to Contract No. F19628-77-C-0244 awarded by the Department of the Air Force, Electronic Systems Division (PPR).

BACKGROUND OF THE INVENTION

1. Field of Invention

This invention relates to encapsulation of SAW devices, and more particularly to a method and apparatus for vacuum encapsulation of a SAW device.

2. Description of the Prior Art

SAW devices are well known in the art and find utility in a number of different applications including high frequency oscillators, pressure transducers, and encoders/correlators of PSK encoded signal information. The outstanding features of the SAW devices are: their ability to provide real time delays of electromagnetic waves within comparatively short, acoustic wavelength substrate materials, and their inherent rugged construction, permitting their use in high vibration and G force environments. The use of SAW delay lines in high frequency oscillator circuits is well known, and is particularly attractive as an alternative to bulk wave resonators which are highly sensitive to vibration, however, the high accuracy and stable frequency characteristics of the bulk resonators require that any competing SAW oscillator be protected from contamination which changes the acoustic wave propagation velocity through the SAW substrate. Any change in velocity results in a change in the SAW time constant (the real time delay provided by the SAW) which in turn causes frequency shifting of the SAW oscillator. Typical of the high accuracy requirements for the bulk wave resonators is the aging requirement, i.e. the result of change in the bulk resonator fundamental frequency with time, which as reported in a paper entitled "A New Ceramic Flat Pack For Quartz Resonators", by T. D. Wilcox et al. presented at the 29th Annual Frequency Control Symposium (1975), is on the order of two parts in $10^{10}$ per week, for a 5 megahertz fundamental mode crystal unit. The severity of this aging requirement may better be appreciated by the statement by Wilcox et al that a change of one monolayer (single atomic layer) on the surface of a quartz crystal (molecules landing on, or driven off of the surface) corresponds to a frequency change of about one part in $10^6$ (0.0001%). Since the surface acoustic wave propagates across the SAW substrate with atomic particle motion confined to a depth of approximately one wavelength from the surface of the substrate, the problem of surface contamination of the SAW substrate is particularly acute. Therefore, any practical utilization of SAW oscillators as replacements for the bulk resonators requires that the SAW device be vacuum encapsulated.

Vacuum encapsulation of SAW devices, however, presents further problems affecting stability which may be more severe than surface contamination, specifically the thermal strain induced in the SAW substrate from thermal expansion and contraction of the encapsulating structure. These induced thermal strains provide distortion of the SAW substrate resulting in changes in the wave propagation velocity and, therefore, the SAW time constant. The prior art packaging techniques used in related electronic industries, such as the semi-conductor industry, and the packaging techniques for bulk resonators, are not appropriate for providing vacuum encapsulation of the SAW devices. As an example, the encapsulation of bulk crystal resonators, such as the state of the art package reported by Wilcox et al, provides for thermal and mechanical isolation of the resonator from the encapsulating structure by suspension of the resonator through its electrical interconnecting leads within the package, thereby isolating the resonator from the package thermal expansion characteristics, and allowing free movement of the resonator. This, however, results in the resonators susceptability to vibration. While a similar arrangement for a SAW device may be provided, i.e. suspension of the SAW substrate in the package through the interconnections to its electrodes, this would effectively eliminate one of the main attractions of the SAW device, its ability to withstand high vibration environments. Similarly, the semi-conductor industry technique of providing metal can encapsulation of the integrated circuits is unsuitable due to the dissimilar thermal characteristics of the metal can, which if bonded to the SAW substrate produces undesirable strain in the substrate causing changes in the acoustic wave velocity and SAW time constant.

SUMMARY OF THE INVENTION

One object of the present invention is to provide a vacuum encapsulated SAW structure which minimizes induced thermal strain in the SAW substrate. Another object of the present invention is to provide a method for vacuum encapsulating a SAW device in a vacuum encapsulation structure which induces substantially zero strain in the SAW substrate resulting from thermal expansion and contraction of the structure. Still another object of the present invention is to provide both method and apparatus for encapsulating a SAW device in a minimum vacuum of $10^{-6}$ torr.

According to the present invention, a vacuum encapsulated SAW structure includes a SAW device having a substrate of desired material with a major surface on which electro-acoustic transducers having associated conductive electrodes are disposed along an acoustic wave propagation path defining the active signal region of the SAW device, the electrodes providing electrical connections for external signals presented to and from the active signal region, the encapsulated SAW structure further including a cover formed from material having substantially the same thermal characteristics and substantially the same crystallographic orientation as the substrate material, the cover being vacuum sealed to the substrate major surface with its crystallographic axes in alignment with that of the substrate to enclose the active signal region in a vacuum environment. In further accord with the present invention, the cover is formed from the same material as that comprising the substrate. In still further accord with the present invention, the vacuum seal is electrically insulative to provide for the electrical continuity of each electrode through the vacuum seal.

In still further accord with the present invention, a method for vacuum encapsulating a SAW device in a vacuum encapsulation structure includes the steps of forming the cover from material having substantially the same thermal characteristics and substantially the same crystallographic orientation as the substrate material, and aligning the crystallographic axes of the cover with the substrate prior to vacuum sealing of the cover to the substrate surface. In still further accord with the present invention, the step of forming the cover includes the steps of fabricating separate cap and spacer assemblies, marking each assembly with the crystallographic orientation of each, and after alignment of the crystallographic axes of the spacer and cap assemblies with that of the substrate bonding the spacer assembly to the substrate in a desired atmosphere with a glass seal, and bonding the cap to the spacer in a vacuum environment with a metal seal.

The vacuum encapsulated SAW structure of the present invention provides vacuum encapsulation of a SAW device while providing a minimum of induced thermal strain due to competing thermal characteristics between the encapsulating structure and the SAW substrate. The method of the present invention provides a structure exhibiting a high quality, vacuum tight glass seal between the cover and substrate while insuring electrical continuity of the electrodes through the seal. These and other objects, features and advantages of the present invention will become more apparent in the light of the following detailed description of preferred embodiments thereof, as illustrated in the accompanying drawing.

BRIEF DESCRIPTION OF THE DRAWING

FIG. 1 is a perspective, exploded view of a vacuum encapsulated SAW device according to the present invention;

FIG. 2 is a perspective view of a Y-cut wafer used in the assembly of FIG. 1; and FIG. 3 is an illustration of a right side view of the assembled vacuum encapsulated SAW device illustrated in FIG. 1.

DETAILED DESCRIPTION

Referring to FIG. 1, in a perspective, exploded view, a vacuum encapsulated SAW device 10 is illustrated as having three major structural members including a SAW device 12, a spacer assembly 14 and a top portion, or cap 16. The SAW, device 12 may have any one of a number of known SAW configurations which include a planar substrate 18 having a major surface 20 on which electro-acoustic transducers 22, 24 are disposed adjacent to a surface acoustic wave propagation region 25. The transducers and acoustic wave propagation region are common to each SAW device and their location on the surface 20 defines the active signal region of the SAW substrate 18, shown generally by that surface area bounded by the phantom line 26. As known, the transducers provide the launching and receiving of the acoustic waves propagating through the substrate 18. The substrate may comprise peizoelectric material or piezoelectric material may be inserted between the transducers and major surface, in which case the substrate itself may be non-piezoelectric.

In FIG. 1 the electro-acoustic transducers 22, 24 are illustrated as comprising one configuration of an interdigital (ID) transducer, each including a pair of opposite phase electrodes 27, 28 and 29, 30 respectively, each opposite phase electrode including a plurality of fingers interleaved with those of the opposite phase electrode of the pair. The electrodes 27-30 are each connected to an associated one of a plurality of electrical conductors 31-34 extending out of the active region 26 to permit electrical interconnection between each electrode and the associated electronic circuitry used with the SAW device. As may be known, there are a number of different electro-acoustic transducer configurations, including variations of the ID pattern itself. Similarly, although the illustrated SAW device 12 represents a common configuration for a simple SAW delay line which may be used in high frequency SAW oscillators and SAW pressure sensing devices, the exact configuration of the SAW device does not form any part of the present invention, such that the device may equally well comprise any one of a number of other known SAW devices including a SAW resonator, a SAW PSK encoder/correlator as disclosed in U.S. Pat. No. 4,070,638, or a differential surface acoustic wave transducer having any of the configurations disclosed in U.S. Pat. No. 4,100,811. The illustrated SAW delay line embodiment of the device 12 is intended only as exemplary of the common characteristics of a SAW device, which include the electro-acoustic transducers disposed adjacent to an acoustic wave propagation region on the SAW substrate surface to provide an active signal region, and the metallized conductors providing interconnection to and from the active signal region.

In the present invention, the conductors 31-34 and opposite phase electrodes 27-30 are deposited on the surface 20 through one of a number of processes, and may comprise thin-film aluminum, however, the metallized aluminum coating for the conductors is provided at a greater coating thickness than that of the electrodes to ensure electrical conductivity to the electrodes following vacuum encapsulation of the SAW in the fabrication process described in detail hereinafter.

The spacer 14 and cap 16 in combination comprise a cover assembly for the encapsulated SAW device 10. Each are fabricated from material having substantially the same thermal expansion characteristics as the material comprising the substrate 18, and preferably comprise the same material as the substrate. In the exemplary embodiment of FIG. 1, the substrate 18 comprises piezoelectric quartz crystal material cut from a bulk quartz crystal in any one of a number of known crystallographic orientations deemed suitable for the particular SAW device application, such as a Y-cut or ST-cut wafer, each having anistropic temperature coefficient characteristics. Once the particular type of cut crystal material selected for the substrate 18 is known, the spacer 14 and cap 16 can then be fabricated from the identical type of cut crystal.

The spacer 14 is illustrated as being cylindrical with upper and lower surfaces 36, 38, and an inside diameter large enough to circumscribe the active signal region 26. The spacer, however, need not be cylindrical but may include any geometry configuration having a central aperture dimensioned to circumscribe the transducers 22, 24 and acoustic wave propagation path 25. The projected area of the lower surface 38 of the spacer 14 on the surface 20 is illustrated as that bounded between phantom lines 26 and 40, illustrating that portion of the surface 20 which mates with the spacer 14, i.e. the bearing surface. The height (h) of the spacer is selected at a value sufficient to prevent strain from being induced into the substrate 18 from a metal seal used to bond the cap 16 to the upper surface 36 of the spacer 14, which is provided in the fabrication processes described in detail hereinafter.

The geometry of the cap 16 is dependent on that of the upper surface of the spacer to which it is bonded. For the cylindrical spacer 14, the cap 16 is illustrated as having a circular geometry, having a bottom surface 42 and outside diameter equal to that of the spacer ring.

In the fabrication of the vacuum encapsulated SAW device 10, the spacer 14 and cap 16 are formed from the identical type material as the substrate 18, as stated hereinbefore. This includes the identical crystallographic orientation. In FIG. 1 the substrate 18 comprises a Y-cut quartz crystal, as illustrated by the Y-cut wafer 44 of FIG. 2, having the crystallographic axes orientation illustrated. The substrate 18 (FIG. 1) formed from the Y-cut wafer 44 has a direction of SAW propagation along the crystallographic X-axis 46 (FIGS. 1, 2), such that the direction of the X-axis ma be used to identify the crystallographic axes orientation, although any one or all of the axes may be used if so desired. In the embodiment of FIG. 1, the direction of the X-axis 46 is identified during manufacture of the substrate 18 by identifying marks on the substrate, such as by the substrate geometry, i.e. a rectangular substrate indicating the direction of propagation axis lying along the larger dimension, or by some suitable indices on the substrate such as phantom notches 48, 50. The crystallographic axes orientation of the spacer and cap material is similarly identified during fabrication of these elements by the same axis selected for identifying the substrate. For the cylindrical geometry illustrated in FIG. 1, identification may include truncated flats 52, 54 for the spacer 14 and cap 16 respectively, each flat having its surface perpendicular to the X-axis 46.

Following fabrication of the spacer and cap, a metallized layer 56, such as chrome-gold is deposited along the upper surface 36 of the spacer 14 and on that portion of the bottom surface 42 of the cap 16 which mates with the upper surface of the spacer. The metallized layer is deposited on the surfaces in any one of a number of known methods, such as by RF sputtering, after the central portion of the bottom surface of the cap is masked off so that only the mating surface of the cap is exposed to the sputtering process. The chrome-gold is sputtered onto the surfaces at typical coating thicknesses on the order of 1,000 angstroms of chrome and 10,000 angstroms of gold.

Following deposition of the metallized layer 56, the bottom surface 38 of the spacer 14 is coated with a glass frit. The frit may be either vitreous, or devitrifying type. The typical frit coating thickness is in the range of 25–100 microns. The SAW device 12 is placed in an oven chamber and the spacer is placed over the active signal region of the substrate, mating with the surface 20 in the approximate location indicated by phantom lines 26, 40. During placement the spacer is adjusted to provide crystallographic axes, i.e. align the X-axis 46, of the spacer and substrate. Following the placement and proper orientation of the spacer the combination substrate and spacer are subjected to a temperature above the frit melting point. The frit selected, whether vitreous or devitrifying, must have a melting point temperature below 550° C., an upper maximum temperature limit which if exceeded causes the quartz crystal to experience a phase transition which may result in degradation of the piezoelectric properties causing the substrate to become unsuitable for SAW propagation. For a vitreous glass frit, the typical melting point temperature and firing time are 425° C. and fifteen minutes.

After the frit has become molten, the oven temperature is reduced and the substrate and bonded spacer are allowed to cool. The fritting step fuses the spacer to the surface of the substrate, providing a vacuum tight seal between each. The frit seal also allows for electrical continuity of the conductors 31–34 and for the effective electrical insulation of the electrodes from each other through the seal area. The fritting process does cause some oxidation of the metallized aluminum electrodes in the region of the seal, which is absorbed into the molten glass during formation of the seal. Electrical conductivity of the conductors through the seal area is ensured by providing a sufficiently thick aluminum coating during the initial deposition of the aluminum on the substrate surface. The amount of aluminum oxidized depends on the particular glass frit, and the required melting point temperature and firing time.

The fritting processes is one of a number of methods of providing a glass seal between the spacer and substrate. Any other method of creating a glass seal which is vacuum tight and electrically insulative may also be used provided that the substrate and spacer are not subjected to temperatures above the maximum limit.

The partial structure of the device 12 and bonded down spacer 14 is cleaned in an ultra-violet ozone cleaning tank to remove impurities from the structure, and then placed in a temperature/vacuum chamber. The cap 16 is also placed in the chamber and held there in a fixture which allows for alignment of the cap with the upper surface 36 of the spacer. In this step the cap 16 is metal sealed to the upper surface 36 in a vacuum environment of at least $10^{-6}$ torr ($10^{-6}$ millimeters of mercury). The metal seal may be accomplished in a number of ways involving soldering the chrome-gold metallized layer 56 on each of the surfaces 36, 42 to each other using a tin-gold alloy solder having typically 90% tin, 10% gold. The solder may be introduced as a tin-gold preform shaped to the area of the upper surface 36 and placed on the upper surface 36 within the temperature vacuum chamber. The vacuum environment is then established in the chamber while the temperature is established at approximately 250° C. All of the elements are baked at the set vacuum and temperature values until there is no further evidence of out-gassing. At that time the cap 16 is placed on the upper surface of the spacer with the tin-gold preform interposed and adjusted to align the X-axis 46 of the cap with that of the spacer and substrate. The temperature in the chamber is then increased to the melting point temperature of the tin-gold alloy, approximately 282° C., melting the solder and fusing the cap to the spacer in a vacuum tight metal seal. The temperature is then reduced and the metal seal allowed to cool, after which the completed structure 10 is removed from the chamber. FIG. 3 is a non-dimensioned illustration of the vacuum encapsulated SAW device 10 following complete fabrication, and illustrates the glass frit seal 60 and metal seal 62.

In an alternative method of providing the metal seal between the cap 16 and spacer 14 in which a tin-gold preform is not used, the tin-gold alloy is deposited directly on one or both of the surfaces 36, 42 following deposition of the chrome-gold alloy 50. The tin-gold may be deposited in a similar RF sputtering process used to deposit the chrome-gold.

In the vacuum encapsulated SAW structure of the present invention thermally induced strains in the SAW substrate 18 resulting from thermal cycling of the encapsulating structure are reduced substantially to zero. The structure may be fabricated from any material having the same thermal characteristics and crystallographic orientation as that of the SAW substrate, and in a preferred embodiment would be fabricated from the same substrate material. The process of fabricating the vacuum encapsulated structure provides a simple step process using materials and apparatus known in the art, and results in a structure which seals the active region of the SAW device in a vacuum environment of at least $10^{-6}$ torr. The reduction of induced thermal strain in the SAW substrate and encapsulation of the SAW active region in a vacuum environment provides a SAW device having greatly improved stability characteristics for the acoustic wave propagation velocity. Similarly, although the invention has been shown and described with respect to an illustrative embodiment thereof, it should be understood by those skilled in the art that the foregoing and various other changes, omissions and additions in the form and detail thereof may be made therein without departing from the spirit and the scope of the invention.

Having thus described a typical embodiment of our invention, that which we claim as new and desire to secure by Letters Patent of the United States is:

1. A vacuum encapsulated surface acoustic wave (SAW) structure, comprising:
   a SAW device including a substrate of desired material having a major surface on which electro-acoustic transducers and associated electrical conductors are disposed along an acoustic wave propagation path on said substrate, said transducers and propagation path defining an active signal region on said major surface, said electrical conductors providing electrical connections for external signals presented to and received from the active signal region; and
   a cover, formed of material having substantially the same thermal characteristics and the same crystallographic orientation as the material comprising said substrate, said cover being bonded through a vacuum tight seal to said major surface of said substrate to enclose said active signal region in a vacuum environment.

2. The structure of claim 1, wherein said cover is orientated on said major surface such that the crystallographic axes of said cover material is in alignment with that of said substrate material.

3. The structure of claim 2, wherein said cover is formed of the same material as that comprising said substrate.

4. The structure of claim 1, wherein said cover is bonded to said major surface with a vacuum tight glass seal.

5. The structure of claim 4, wherein said vacuum tight glass seal is a glass frit seal.

6. A vacuum encapsulated surface acoustic wave (SAW) structure comprising:
   a SAW device including a substrate of desired material having a major surface on which electro-acoustic transducers and associated electrical conductors are disposed along an acoustic wave propagation path on said substrate, said transducers and propagation path defining the surface area of an active signal region on said major surface, said electrical conductors providing electrical connections for external signals presented to and received from the active signal region; and
   a cover, including a spacer assembly portion and a cap assembly portion each formed of material having substantially the same thermal characteristics and crystallographic orientation as the material comprising said substrate material, said spacer portion having a central aperture extending between an upper surface and a bottom surface thereof, said aperture having a minimum cross section area equal to the surface area of said active signal region, said spacer portion being positioned on said major surface to enclose said active signal region within said central aperture, and being bonded along its bottom surface to said major surface with a vacuum tight glass seal, said cap portion being bonded in position to said upper surface of said spacer with a vacuum tight metal seal to enclose said active signal region in a vacuum environment within said central aperture.

7. The structure of claim 6, wherein said spacer and said cap portions are further positioned to provide orientation of the material crystallographic axes of each with that of said substrate material.

8. The structure of claim 7, wherein said spacer and said cap assembly portions are formed of the same material as that comprising said substrate.

9. The structure of claim 6, wherein said transducers and said associated electrical conductors comprise metallized aluminum deposited on said major surface, wherein said electrical conductors are deposited at a greater coating thickness than said transducers along the portion of the conductors extending through said glass seal.

10. In the vacuum encapsulation of a surface acoustic wave (SAW) device having a substrate of desired material, the method of minimizing strain produced in the substrate material by thermal expansion and contraction of a vacuum encapsulating structure, comprising the steps of:
    forming the vacuum encapsulating structure from material having substantially the same thermal characteristics and substantially the same crystallographic orientation as that of the substrate material;
    positioning the encapsulating structure on the substrate to provide alignment of the crystallographic axes of each; and
    bonding the encapsulating structure to the substrate in a vacuum environment.

11. The method of claim 10, wherein the vacuum encapsulating structure is formed from material identical to that of the substrate material.

12. The method of vacuum encapsulating a SAW device of the type which includes a substrate material having a major surface on which electro-acoustic transducers are disposed within an active signal region thereof, and which further includes electrical conductors disposed on said major surface to provide electrical connections for external signals presented to and received from the transducers within the active signal region, comprising the steps of:
    forming a cover assembly which includes a spacer portion and a cap portion each fabricated with material having substantially the same thermal characteristics and substantially the same crystallographic orientation as that material comprising the substrate, the spacer being shaped to provide a central aperture extending between an upper surface and a bottom surface thereof and having a minimum cross sectional area equal to that of the active signal region;
    orientating the spacer portion over the active signal region on the major surface, and aligning the crystallographic axes of the spacer material with that of the substrate material;

bonding the bottom surface of the spacer portion to the major surface with a vacuum tight glass seal; and sealing the cap portion to the upper surface of the spacer with a metal seal in a vacuum environment following alignment of the crystallographic axes of the cap with that of the spacer and substrate.

13. The method of claim 12, wherein the spacer and cap portions of the cover assembly are fabricated from the same material as that comprising the substrate.

14. The method of claim 12, wherein the step of bonding is provided by forming the glass seal using a glass frit.

15. The method of claim 12, further comprising between the steps of bonding and sealing, the step of:

baking the SAW device with the bonded spacer, and the cap portion at an accelerated temperature in a vacuum environment to eliminate out-gassing from each.

16. The method of claim 15, further comprising between the steps of bonding and baking, the step of:

cleaning the SAW device with the bonded spacer in an ultra-violet ozone cleaning tank to remove organic impurities.

17. The method of claim 12, further comprising prior to the step of forming, the step of:

depositing the electrical conductors on the major surface such that the coating thickness of the conductors along that portion which passes through the glass seal is at a greater value than that of the transducers.

* * * * *